SEMICONDUCTOR DEVICES AND METHODS OF MAKING THEM

Filed Nov. 20, 1958

INVENTORS
DIETRICH A. JENNY &
DIETRICH MEYERHOFER
BY W. S. Hill
AGENT 2,956,216

SEMICONDUCTOR DEVICES AND METHODS OF MAKING THEM

Dietrich A. Jenny and Dietrich Meyerhofer, Princeton, N.J., assignors to Radio Corporation of America, a corporation of Delaware Filed Nov. 20, 1958, Ser. No. 775,163

12 Claims. (Cl. 317—235)

This invention relates to improved semiconductor devices. More particularly, the invention relates to improved devices utilizing compound semiconductive materials, and to improved methods of making such devices.

In the art of making semiconductor circuit elements such as diodes and transistors, the semiconductive materials most often used are elemental germanium and silicon. Certain binary solid compounds also exhibit useful semiconductive properties. These materials are known as III–V compounds because they are made of one element from the third column and one element from the fifth column of the periodic table. Examples of such compounds are the phosphides, arsenides and antimonides of aluminum, gallium and indium. The III–V compounds have some advantages over conventional materials such as germanium and silicon: for example, the mobility of negative charge carriers is usually much greater in most of these compounds than in germanium or silicon. However, it has been found difficult to fabricate satisfactory devices such as diodes and transistors utilizing these compound materials. One of the problems in the manufacture of junction type semiconductor devices from III–V compounds is the difficulty of making good ohmic or non-rectifying contacts on wafers of these materials. The fabrication of good ohmic contacts from these materials is particularly difficult in the case of devices capable of high temperature operation.

An object of this invention is to provide improved semiconductive devices utilizing compound semiconductors.

Another object of this invention is to provide improved circuit elements utilizing III–V compounds.

A further object is to provide improved methods of fabricating III–V compound semiconductor devices.

Still another object of this invention is to provide improved ohmic contacts for semiconductive devices made of III–V compounds.

A further object is to provide improved methods of effecting ohmic (non-rectifying) contacts to III–V compound semiconductor bodies.

Yet another object of this invention is to provide an improved type of transistor for high temperature operation, having improved non-rectifying electrodes.

These and other objects of the invention are accomplished by alloying a pellet of electrode material selected from the group consisting of tin telluride and mixtures of tin telluride with tin to a surface of a monocrystalline semiconductive III–V compound wafer of N-conductivity type. It has unexpectedly been found that tin telluride makes an excellent ohmic contact to all N-conductivity type wafers of these materials. If desired, the electrical conductivity of the electrode may be increased by using a mixture of tin telluride with tin.

Figure 1:
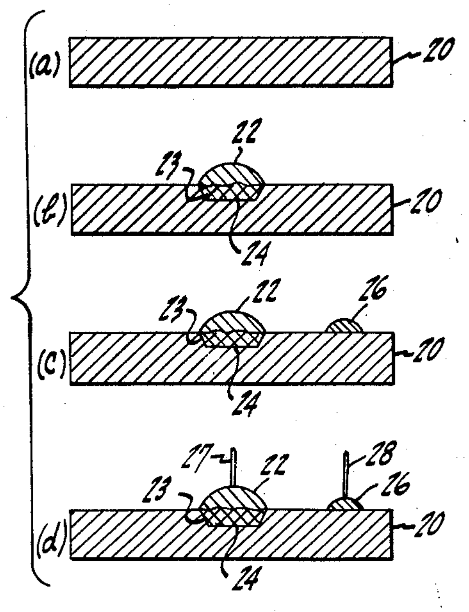
Figure 2:
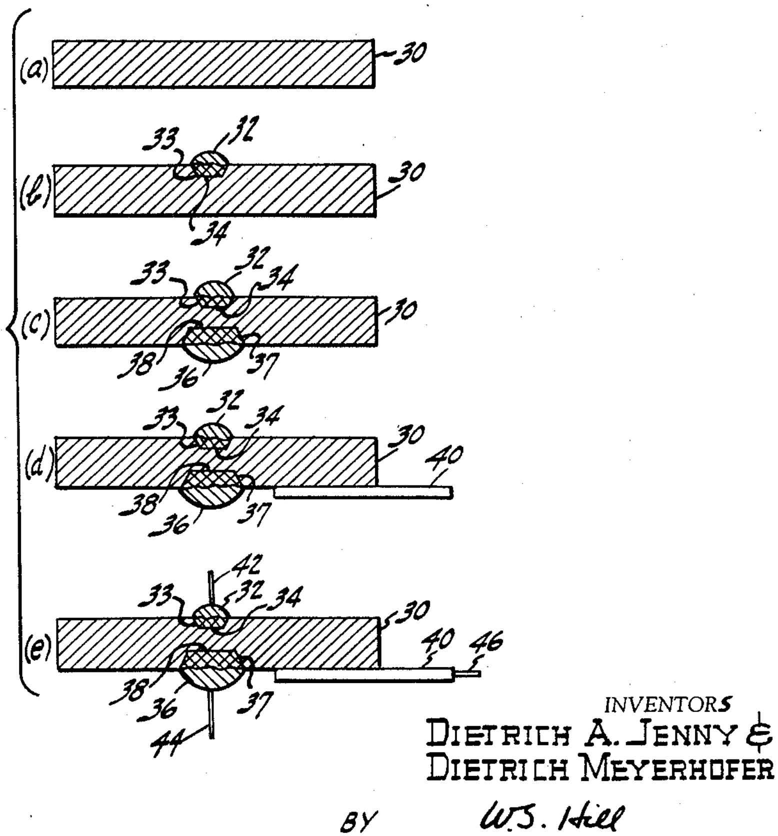

The invention and its advantages will be described in greater detail with reference to the accompanying drawing, in which:

Figures 1*a*–1*d* are cross-sectional schematic views of successive steps in the fabrication of a diode having the features hereinbefore mentioned;

Figures 2*a*–2*e* are cross-sectional schematic views of successive steps in the fabrication of a transistor according to another embodiment of the invention.

Similar reference characters are applied to similar elements throughout the drawing.

Referring to Figure 1*a* of the drawing, a semiconductor body is prepared as a wafer 20 of a monocrystalline semiconductive III–V compound selected from the phosphides, arsenides, and antimonides of aluminum, gallium and indium. The semiconductor body 20 may be of either conductivity type. In this example, the material used is indium phosphide of N-conductivity type. The size of the wafer 20 is not critical. A suitable wafer may be about 100 mils square and about 10 mils thick.

Referring to Figure 1*b*, a rectifying electrode is made to the wafer 20 by alloying to one face of the wafer a pellet 22 of material that induces conductivity of type opposite to that of the wafer. Since the wafer of starting material in this example is of N-conductivity type, the material selected for the electrode pellet 22 must be one which induces P-conductivity type in indium phosphide. Zinc, cadmium and mercury are suitable materials for inducing P-type conductivity in indium phosphide and the other III–V compounds. If desired, these conductivity type-determining materials may be alloyed with a soft metal which is electrically inert with respect to the wafer and serves as a carrier. In this example, the electrode pellet 22 consists of cadmium, which melts at 320° C. The pellet may be in the form of a small disc, a ring, or a spherule known as a dot. The dot 22 is alloyed to one face of the wafer by contacting the dot to the wafer and heating the assembly to about 500° C. for about 20 minutes. Preferably, the heating is performed in a reducing atmosphere, to avoid oxidation of the materials. The cadmium dot 22 melts and dissolves the portion 23 of the wafer which is adjacent and just below the electrode pellet 22. When the wafer is cooled, the wafer portion 23 recrystallizes, but contains sufficient cadmium so as to be converted to P-conductivity type. At the interface 24 between the P-type region 23 and the N-type bulk of the wafer 20, a rectifying barrier known as a PN junction is formed. The surface of the wafer 20 may then be cleaned by immersing the wafer in an etchant. A suitable etchant for the semiconductive III–V compounds is composed of equal volumes of concentrated nitric acid and concentrated hydrochloric acid.

Referring to Figure 1*c*, a non-rectifying electrode is fabricated by alloying or fusing to a surface of the wafer 20 a pellet 26 of material selected from the group consisting of tin telluride and mixtures of tin telluride with tin. A reducing atmosphere such as hydrogen or forming gas is preferred during alloying to avoid oxidation. In this example, the pellet 26 consists of tin telluride. The pellet 26 is contacted to the wafer surface, and the assembly is heated to a temperature above the melting point of the electrode pellet but below the melting point of the semiconductor wafer. Tin telluride melts at about 780° C., while indium phosphide melts at about 1050° C. It has been found that good results may be obtained by alloying within the temperature range of a few degrees above the melting point of the electrode pellet to a few degrees below the melting point of the semiconductor wafer. Alloying in fact takes place even at the melting point of tin telluride. In this example, the assembly of electrode pellet 26 and wafer 20 is heated in a hydrogen atmosphere for about 10 minutes at about 800° C. The contact thus formed between the tin telluride pellet 26 and the N-type indium phosphide wafer 20 is ohmic in character, and mechanically strong, even when the surface of the indium phosphide is relatively dirty.

Referring to Figure 1*d*, the device is completed by attaching electrical leads 27 and 28 to the rectifying electrode 22 and the non-rectifying electrode 26 respectively. The unit is subsequently mounted and cased by conventional means known in the art.

The resulting diodes have the advantage of operating successfully at higher temperatures than comparable prior art units using germanium or silicon as the semiconductive material. Semiconductor devices are limited as to operating temperatures because a hot device has sufficient thermal energy to raise substantial numbers of electrons across the energy gap between the valence band and the conduction band, thus adversely affecting the performance parameters of the unit. The greater the energy gap of the semiconductor used, the higher the temperature at which the device can operate, provided the electrodes of the device remain operative. However, if the energy gap of a semiconductor becomes too large, the material becomes similar to an insulator in its properties, and is not practical for devices such as transistors. The energy gap of germanium is about 0.7 electron volt, and most germanium semiconductive devices become inoperative above 80° C. Silicon semiconductive devices can be successfully operated at higher ambient or dissipation temperatures, as silicon has an energy gap estimated at about 1.1 electron volts. The III–V compounds mentioned above are useful because they have energy gaps greater than that of germanium or silicon, but still within the range of usefulness of a semiconductor. Indium phosphide, which has been mentioned as a representative III–V compound, has an energy gap of 1.25 electron volts. Devices of this class using indium phosphide as the semiconductor can be operated at temperatures as high as 300° C. It has been found that ohmic contacts made in accordance with the invention as described above remain satisfactory throughout the temperature range from room temperature to 300° C.

In addition to diodes, improved triodes of the transistor type may be made by the method of this invention. Referring to Figure 2*a*, a semiconductor body 30 is prepared as a wafer of a monocrystalline semiconductive compound selected from the group consisting of the phosphides, arsenides, and antimonides of aluminum, gallium and indium. The wafer is of N-conductivity type. In this example, the material used is N-conductivity type gallium arsenide. The size of the wafer is not critical, and may be similar to that of the diode described in connection with Figure 1.

Referring to Figure 2*b*, a rectifying electrode is made by alloying to one major face of the wafer a pellet 32 of material that induces conductivity of type opposite to that of the wafer 30. Since the wafer is of N-conductivity type, the impurity material selected must induce P-conductivity type in gallium arsenide. As mentioned above, suitable materials for this purpose are zinc, cadmium, mercury, or alloys of these metals. In this example, the electrode 32 consists of zinc, which melts at 419° C. The zinc pellet or dot 32 is alloyed to one major face of the wafer 30 by contacting the dot to the wafer and heating the assembly to about 800° C. for about 15 minutes. The alloying step is preferably performed in a reducing atmosphere such as forming gas or hydrogen. The electrode pellet 32 melts and dissolves a region 33 of the wafer immediately adjacent the pellet or dot 32. When the assembly is cooled to room temperature, the region 33 recrystallizes and is converted to P-conductivity type, since zinc is an acceptor in gallium arsenide. A rectifying barrier 34 is formed at the interface of the P-type region 33 and the N-type bulk of the wafer 30.

Referring to Figure 2*c*, a second rectifying barrier is formed in the wafer 30 by similarly alloying another zinc electrode pellet 36 to the opposite major face of the wafer 30. The pellet 36 is preferably coaxially aligned with the first electrode 32. In surface alloyed transistors of the class shown, having two electrodes aligned on opposite sides of semiconductor wafers, it has been found advantageous to make one electrode larger than the other, and utilize the smaller electrode as the emitter, while the larger electrode is made the collector. In this example, the second electrode pellet 36 is larger than the first electrode pellet 32. The wafer region 37 adjacent the pellet 36 is converted on recrystallization to P-conductivity type. A PN junction 38 is formed at the interface of the P-type region 37 and the N-type bulk of the wafer 30.

Referring to Figure 2*d*, a base tab 40 is soldered to a surface of the wafer 30. The connection between the base tab 40 and the gallium arsenide wafer 30 must be ohmic in character. According to this invention, suitable materials for this purpose are tin telluride and mixtures of tin telluride with tin. In this example, the base tab 40 consists of nickel, and is soldered to the gallium arsenide wafer by means of a mixture of tin telluride and tin. The amount of tin utilized in the mixture may vary from a few percent up to a mixture which contains one mol tin telluride to three mols of tin. In this example, the mixture contains 40 percent by weight tin telluride, balance tin, and melts at about 700° C. The tab 40 is attached to the wafer 30 by means of this solder at a temperature of about 800° C. It is preferred to avoid air or other oxidizing atmospheres during the heating step, in order to minimize oxidization of the wafer. Heating is preferably performed in a reducing atmosphere such as hydrogen or forming gas. The tin-tin telluride mixture acts as an ohmic high melting point solder between the tab and the wafer. Pure tin or ordinary solders cannot be used in devices intended to operate at elevated temperatures, since tin melts at 231° C.

Referring to Figure 2*e*, the transistor is completed by cleaning the wafer surface in the etchant described above, and then attaching leads 42, 44, and 46 to the emitter 32, the collector 36, and the base tab 40 respectively.

Although the above embodiments of the invention have been described in terms of gallium arsenide as the semiconductive material, it will be understood that indium phosphide and gallium arsenide have been mentioned as representative examples of the compounds which may be used, and not as a limitation. The invention may be practiced with all the other III–V compounds, such as gallium phosphide, aluminum arsenide, and aluminum antimonide. If desired, the transistor of Figure 2 may be fabricated with a tin telluride-tin electrode pellet as the ohmic contact to the base wafer, instead of base tab 40. Other semiconductive devices may be made by the method of this invention from these materials, each device having at least two regions of opposite conductivity type separated by a rectifying PN junction, and at least one non-rectifying ohmic electrode selected from the group consisting of tin telluride and mixtures of tin telluride with tin.

As mentioned above, the device made in accordance with the instant invention may be successfully operated at ambient temperatures considerably higher than the limiting operating temperatures for germanium and silicon units. Ohmic electrodes made of tin telluride or tin telluride-tin mixtures in accordance with the instant invention may be employed for devices intended to operate up to about 300° C. The tellurides of indium, gallium, and lead may also be employed, but they are not as satisfactory as tin telluride.

Devices of the type described above have other advantages besides the ability to operate at elevated temperatures. An important semiconductor parameter is the mobility of charge carriers in the material. High mobility is particularly desirable for the minority charge carriers in devices such as transistors. The mobility of negative charge carriers (electrons) in germanium is about 3900 $cm.^2$/volt sec. The mobility of electrons in silicon is smaller, being about 1500 $cm.^2$/volt sec. Some of the III–V compounds mentioned have considerably higher mobilities. For example, the mobility of electrons in indium phosphide is at least 3500 $cm.^2$/volt sec.; in indium arsenide, about 23,000 $cm.^2$/volt sec.; in indium antimonide, about 65,000 $cm.^2$/volt sec. Gallium arsenide, which has been mentioned as a representative example of the compound semiconductors, has an electron mobility of at least 4500 $cm.^2$/volt sec., and thus unites the advantages of a charge carrier mobility greater than that of germanium with the advantages of an energy gap greater than that of silicon. Semiconductors with high electron mobility are particularly suitable for NPN devices of the type described in connection with Figure 2.

There have thus been described new and useful forms of semiconductor devices, as well as methods for making these devices.

What is claimed is:

1. A circuit element comprising a body of an N-conductivity type semiconductive III–V compound, said body having at least one rectifying electrode attached thereto, and at least one ohmic electrode fused to said body, said ohmic electrode comprising a member of the group consisting of tin telluride and mixtures of tin telluride with tin.

2. A circuit element comprising an N-conductivity type semiconductive body of material selected from the group consisting of the phosphides, arsenides and antimonides of aluminum, gallium and indium, said body having at least one N-type region separated a P-type region by a rectifying barrier, and at least one ohmic electrode fused to an N-type region of said body, said electrode comprising a member of the group consisting of tin telluride and mixtures of tin telluride with tin.

3. A circuit element comprising a semiconductive body selected from the phosphides, arsenides and antimonides of aluminum, gallium and indium, said body having at least two regions of given conductivity type and one region of opposite conductivity type therebetween separated from said two regions by rectifying barriers, and at least one non-rectifying electrode surface alloyed to an N-conductivity type region of said body, said electrode comprising a member of the group consisting of tin telluride and mixtures of tin telluride with tin.

4. A junction type semiconductor device including a semiconductive compound wafer selected from the phosphides, arsenides and antimonides of aluminum, gallium and indium, said wafer containing at least one rectifying barrier between a P-conductivity type and an N-conductivity type region, and at least one ohmic contact to said wafer, said contact comprising a surface alloyed pellet of material selected from the group consisting of tin telluride and mixtures of tin telluride with tin.

5. A semiconductor device including a non-rectifying electrode composed of a member of the group consisting of tin telluride and mixtures of tin telluride with tin, said electrode being fused to a body of N-conductivity type semiconductive material selected from the group consisting of the phosphides, arsenides and antimonides of aluminum, gallium and indium.

6. In the method of making semiconductor devices comprising the steps of forming at least one rectifying barrier in a monocrystalline wafer of semiconductive material selected from the group consisting of the phosphides, arsenides and antimonides of aluminum, gallium and indium, and making an ohmic contact to a portion of said wafer, the improvement comprising fabricating said ohmic contact by alloying to the surface of an N-conductivity type portion of said wafer a pellet of material selected from the group consisting of tin telluride and mixtures of tin telluride with tin.

7. The method of making non-rectifying contacts to N-conductivity type bodies of binary semiconductive compounds selected from the group consisting of the phosphides, arsenides and antimonides of aluminum, gallium and indium, comprising contacting said body with a quantity of electrode material selected from the group consisting of tin telluride and mixtures of tin telluride with tin, and heating said body and electrode material in a reducing atmosphere to a temperature above the melting point of said electrode material but below the melting point of said semiconductive compound.

8. In the method of making a transistor comprising the steps of alloying two rectifying electrode pellets into opposite faces of a wafer of N-conductivity type semiconductive material selected from the group consisting of the phosphides, arsenides and antimonides of aluminum, gallium and indium, the improvement comprising fabricating a non-rectifying base electrode by fusing to a selected portion of the surface of said wafer a pellet of material selected from the group consisting of tin telluride and mixtures of tin telluride with tin.

9. A method of making an electrical device comprising alloying at least one rectifying electrode with a portion of a body of N-conductivity type semiconductive gallium arsenide, and alloying with another portion of said body at least one non-rectifying electrode composed of a material selected from the group consisting of tin telluride and mixtures of tin telluride with tin.

10. A circuit element comprising a wafer of N-conductivity type semiconductive material, said material being selected from the group consisting of the phosphides, arsenides and antimonides of aluminum, gallium and indium, at least one rectifying electrode on one face of said wafer, and a non-rectifying electrode fused to the surface of said wafer, said non-rectifying electrode being composed of a material selected from the group consisting of tin telluride and mixtures of tin telluride with tin.

11. A circuit element comprising a monocrystalline wafer of N-conductivity type semiconductive indium phosphide, at least one rectifying electrode surface alloyed to one face of said wafer, and a non-rectifying electrode alloyed to the surface of said wafer, said non-rectifying electrode being composed of a material selected from the group consisting of tin telluride and mixtures of tin telluride with tin.

12. A semiconductor device comprising a body of N-conductivity type semiconductive material having two rectifying electrodes alloyed to opposite surfaces, said semiconductive material being selected from the group consisting of the phosphides, arsenides and antimonides of aluminum, gallium and indium, said rectifying electrodes being coaxially aligned pellets which include a type-determining impurity material selected from the group consisting of cadmium, zinc, and mercury, and one non-rectifying electrode alloyed to a surface of said body, said non-rectifying electrode being a pellet of material selected from the group consisting of tin telluride and mixtures of tin telluride with tin.

References Cited in the file of this patent

UNITED STATES PATENTS

| | | |
|---|---|---|
| 2,829,422 | Fuller | Apr. 8, 1958 |
| 2,842,831 | Pfann | July 15, 1958 |
| 2,862,160 | Ross | Nov. 25, 1958 |
| 2,866,140 | Jones et al. | Dec. 23, 1958 |